United States Patent
Yi et al.

[11] Patent Number: 5,900,163
[45] Date of Patent: May 4, 1999

[54] METHODS FOR PERFORMING PLASMA ETCHING OPERATIONS ON MICROELECTRONIC STRUCTURES

[75] Inventors: Whi-kun Yi; Dai-sik Moon, both of Kyungki-do; Sung-kyeong Kim, Inchon; Kyung-hoon Kim; Gyu-hwan Kwag, both of Kyungki-do, all of Rep. of Korea

[73] Assignee: Samsung Electronics Co., Ltd., Rep. of Korea

[21] Appl. No.: 08/784,958

[22] Filed: Jan. 16, 1997

[30] Foreign Application Priority Data

May 8, 1996 [KR] Rep. of Korea ............. 96-15149

[51] Int. Cl.$^6$ ........................................ B44C 1/22
[52] U.S. Cl. ................... 216/79; 216/75; 438/719; 438/720
[58] Field of Search .................. 438/710, 718, 438/719, 720, 721, 722, 723, 724, 120; 216/67, 76, 77, 79, 80, 75

[56] References Cited

U.S. PATENT DOCUMENTS

| | | | |
|---|---|---|---|
| 4,490,209 | 12/1984 | Hartman | 156/634 |
| 4,789,426 | 12/1988 | Pipkin | 156/643 |
| 5,126,008 | 6/1992 | Levy | 156/665 |
| 5,296,095 | 3/1994 | Nabeshima et al. | 156/662 |
| 5,368,684 | 11/1994 | Ishikawa et al. | 156/643 |
| 5,437,765 | 8/1995 | Loewenstein | 216/51 |
| 5,591,301 | 1/1997 | Grewal | 156/643.1 |
| 5,691,246 | 11/1997 | Becker et al. | 437/225 |

OTHER PUBLICATIONS

S.M. Sze, *VLSI Technology*, Second Edition, McGraw–Hill Press, 1988, pp. 200–204.

*Primary Examiner*—R. Bruce Breneman
*Assistant Examiner*—Luz Alejandro
*Attorney, Agent, or Firm*—Myers Bigel Sibley & Sajovec

[57] ABSTRACT

A method for etching a layer of a microelectronic structure includes the steps of masking the layer to be etched so that predetermined portions of the layer are exposed, and providing an etching gas. An additional gas is also provided wherein the additional gas generates a compound having a carbene structure when exposed to a plasma discharge. A plasma of the etching gas and the additional gas is generated to thereby etch the exposed portions of the layer and to form the compound having a carbene structure. A polymer can thus be formed from the compound having the carbene structure on the sidewalls of the etched portions of the layer. Accordingly, the profile of the etched layer can be improved.

26 Claims, 4 Drawing Sheets

METHODS FOR PERFORMING PLASMA ETCHING OPERATIONS ON MICROELECTRONIC STRUCTURES

FIELD OF THE INVENTION

The present invention relates to the field of microelectronics and more particularly to manufacturing methods and systems for microelectronic structures.

BACKGROUND OF THE INVENTION

As the capacity and functionality of integrated circuit microelectronic devices increase, the integration of microelectronic elements is also increased. In other words, a number of microelectronic elements fabricated per unit area of a microelectronic substrate is increased. Accordingly, manufacturing techniques must be able to provide high resolution patterns. In particular, dry etching techniques such as plasma fusion etching have been used to achieve high resolution patterns.

Plasma etching processes, however, can be difficult to control. When etching a layer of a microelectronic structure, important characteristics of the etching process include the etch profile, the etch selectivity with respect to a lower layer of the microelectronic structure, the etch rate, and the etch uniformity. These etch characteristics depend primarily on the characteristics of the etching apparatus, and the process gases. In particular, the etch uniformity is primarily dependent on the characteristics of the etching apparatus, while the etch profile, etch selectivity, and etch rate are primarily dependent on the process gases used.

One technique for improving the etching profile is to add a gas which forms a polymer to the gas mixture. The added gas allows the plasma etching process to achieve high resolution patterns. In particular, this technique has been described in "VLSI Technology" by S. M. Sze (2nd Edition, McGraw Hill Press, 1988, pp. 200–204), and U.S. Pat. No. 4,490,209 entitled "Plasma Etching Using Hydrogen Bromide Addition" to Hartman.

When a layer of a material including silicon is etched according to conventional plasma etching techniques, a halogen compound containing fluorine (F) or chlorine (Cl) is provided as a main etching gas. The choice of the compound used for the main etching gas is dependent on the properties of the layer to be etched, the desired etching profile, etching selectivity with respect to another layer of the microelectronic structure, and compatibility with other process gases. Additional process gases can be mixed with the main etching gas. These additional gases have predetermined functions. In particular, inert gases such as helium (He) and argon (Ar) with relatively heavy masses, can act as a carrier for the main etching gas. These inert gases may also aid in etching by physical sputtering. Oxygen ($O_2$) and nitrogen ($N_2$) can be provided and converted to a radical state (O and N) or converted to an ionic state ($O_2^+$ and $N_2^+$) by the plasma discharge. The radical and ionic states of oxygen and nitrogen can be used to control the etching profile by increasing or decreasing the polymers which are generated during the etching process.

In addition, hydrogen bromide (HBr) can be provided and dissociated in the plasma discharge. Bromine can thus be adsorbed on sidewalls of the etched portions of the layer thus forming a Si—Br polymer line. This Si—Br polymer line can act as a passivation layer for the sidewalls adjacent the etched surface. FIGS. 1A and 1B are photographs illustrating a polysilicon layer which has been etched by a conventional plasma etching technique using a mixture of gases including chlorine, hydrogen bromide, oxygen, and argon. As shown in FIGS. 1A and 1B the profile of the etched polysilicon layer is approximately a reverse trapezoid, and the etched perpendicular plane is tilted.

Conventional plasma etching methods may thus be unable to provide sufficiently perpendicular etching profiles. Accordingly, there continues to exist a need in the art for improved plasma etching techniques.

SUMMARY OF THE INVENTION

It is therefore an object of the present invention to provide improved methods for etching layers of microelectronic structures.

It is another object of the present invention to provide etching methods which produce improved profiles for the etched layers.

These and other objects are provided according to the present invention by methods for etching a layer of a microelectronic structure including the steps of mixing an etching gas with an additional gas which generates an intermediate compound having a carbene structure when exposed to a plasma discharge. A plasma is generated to etch exposed portions of the layer, and also to form the intermediate compound having the carbene structure. Accordingly, a polymer is formed from the intermediate compound having the carbene structure on the sidewalls of the etched portions of the layer. This polymer acts as a passivation for the sidewalls thus improving the perpendicularity of the sidewalls and the overall profile of the etched layer.

This method can be used to etch layers of polysilicon, other materials including silicon, silicon oxide, and metal. In particular, the etching gas can be a gas including chlorine such as $Cl_2$, BCl, HCl, or $SiCl_4$. Alternately, the etching gas can be a gas including fluorine such as $F_2$, $SF_6$, $CF_4$ and $CHF_3$. Mixtures of the above mentioned etching gases can also be used.

An inert gas such as helium or argon can also be mixed with the etching gas and the additional gas. By generating a plasma of the inert gas, the inert gas is activated. The inert gas thus collides with exposed portions of a layer being etched to remove etch by-products. In particular, the collision of the inert gas can be used to remove polymers which may form on the bottom etching surface. Accordingly, the formation of polymers does not significantly affect the desired etching of the bottom etch surface.

The additional gas which generates the intermediate compound can be chosen from the group consisting of $CH_3Br$, $CH_2Br_2$, $CHBr_3$, $C_2H_5Br$, $C_2H_4Br_2$, or a mixture thereof. The resulting intermediate compound having the carbene structure can be $C_xH_yBr_z$ wherein each of x, y, and z is an integer having a value of 0 or greater. More particularly, the intermediate compound can be a compound such as hydrogen bromide carbene (CHBr), dihydrogen carbene ($CH_2$), and dibromocarbene ($CBr_2$). If bromomethane ($CH_3Br$) is used as the additional gas, the steps of generating the plasma and forming the polymer can be performed at room temperature.

When the microelectronic structure being etched includes a layer of polysilicon to be etched on a layer of silicon oxide, oxygen can be provided with the etching gas, and the additional gas and a plasma of the oxygen can be generated. The use of oxygen may increase the selectivity of the etch of the polysilicon layer with respect to the silicon oxide layer. More particularly, the ratio of the etching gas to the oxygen can be on the order of 2:1 to 6:1. The plasma can be generated by inductive or capacitive coupling or other known techniques.

According to another aspect of the present invention, a method for etching a layer of a material including silicon on a microelectronic structure is provided. This method can include the steps of masking the layer of the material including silicon so that predetermined portions of layer are exposed, providing an etching gas, and providing an additional gas wherein the additional gas comprises an atom of bromine bonded with another halogen atom. A plasma of the etching gas and the additional gas can be generated to etch exposed portions of the layer, and a protective polymer layer can be formed on sidewalls of the etch portions of the layer. In particular, the additional gas can be chosen from the group consisting of BrI and $Br_2$.

According to a third aspect of the present invention, another method is provided for etching a layer of a material including silicon on a microelectronic structure. This method includes the steps of masking a layer to be etched so that predetermined portions of a layer are exposed, providing an etching gas, and providing an additional gas wherein the additional gas comprises boron tribromide ($BBr_3$). A plasma of etching gas and the additional gas is generated to thereby etch the exposed portions of a layer, and to form a protective polymer layer on sidewalls of the etched portions of the layer. In particular, the step of generating the plasma can include producing bromine and boron bromide which etch the layer of the material including silicon.

The plasma etching methods of the present invention can thus be used to produce etched layers having improved sidewall perpendicularity and improved overall profiles. In particular, the use of a gas which generates an intermediate compound having a carbene structure when exposed to plasma discharge allows the formation of a polymer on sidewalls of the etched portions of the layer which protect the sidewalls during the etching process.

DETAILED DESCRIPTION

Figure 1A:
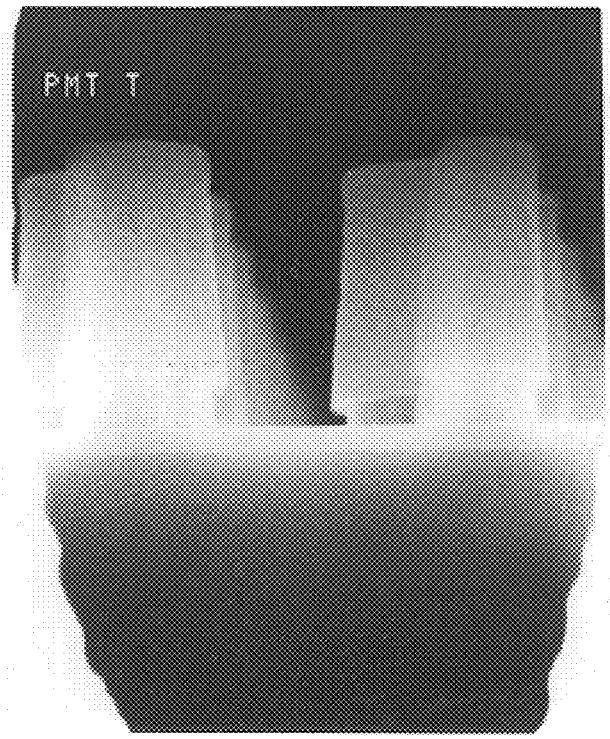
FIGS. 1A and 1B are photographs illustrating the etch profile a layer of material including silicon which has been etched according to a conventional plasma etching method.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Plasma etching methods according to the present invention can be used to etch specific layers of microelectronic structures. In particular, these plasma etching methods can be used to etch layers of materials including silicon, metal layers, polysilicon layers, and silicon oxide layers. The above-mentioned materials can be etched according to the present invention by providing an appropriate mix of gases as discussed below.

Figure 2:
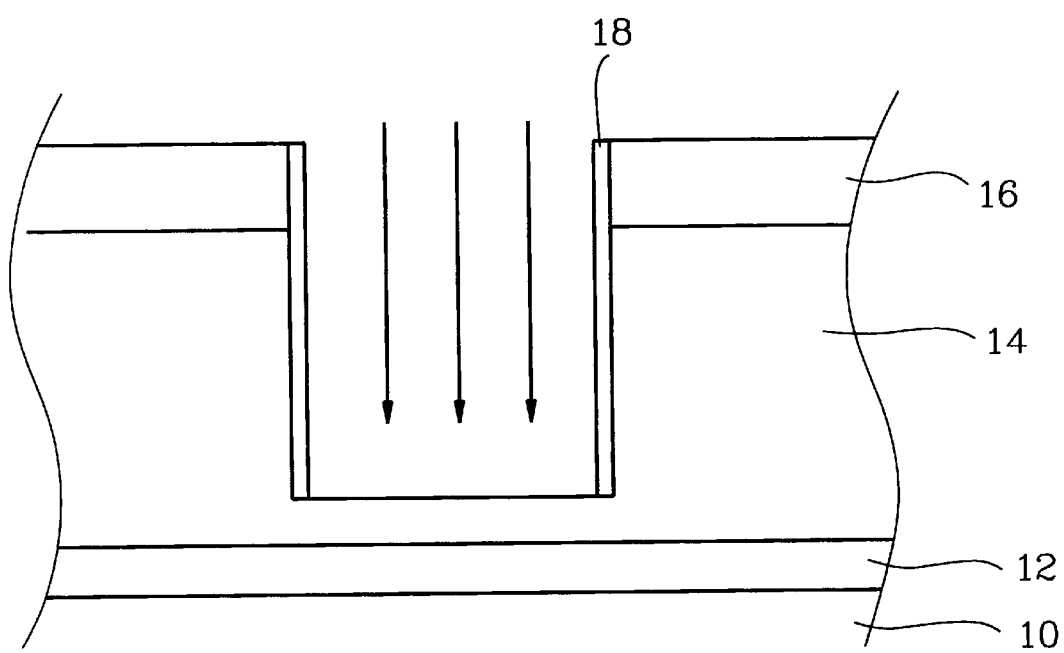
FIG. 2 is a cross-sectional view of a microelectronic structure which has been etched by a plasma etching method according to the present invention.

A method for etching a polysilicon layer according to the present invention will now be discussed with reference to FIG. 2. In FIG. 2, a microelectronic structure includes a substrate 10, a silicon oxide layer 12, a polysilicon layer 14, and a masking layer 16 of photoresist. The substrate 10 can be a monocrystalline silicon substrate, and the silicon oxide layer 12 can be on the order of several hundred angstroms. The polysilicon layer 14 can be on the order of several thousand angstroms to provide a gate for a transistor. The masking layer 16 covers portions of the polysilicon layer 14 which will not be etched.

An apparatus for performing plasma etching operations can generate a plasma by inductive or capacitive coupling or other known techniques. In an inductively coupled plasma etching apparatus, the plasma is inductively generated by winding coils around a quartz tube. When using an inductively coupled plasma etching apparatus, a diffuser including overlapping sheets or layers can be provided to insure uniform mixing of the etching gas and other process gases. In addition, the plasma can be generated using a direct current or a radio frequency bias. The process temperature can be varied according to the process gases used.

When etching polysilicon, a main etching gas can be selected from the group of $Cl_2$, $BCl$, $HCl$, and $SiCl_4$, each of which includes chlorine. A gas such as $CH_3Br$, $CH_2Br_2$, $CHBr_3$, $C_2H_5Br$, or $C_2H_4Br_2$ which generates an intermediate compound having a carbene structure when exposed to a plasma discharge is also provided. In particular, bromomethane ($CH_3Br$) may be preferred because bromomethane exist in a gaseous state at room temperature (about 20° C.). Accordingly, control parameters such as vapor pressure can be controlled relatively easily. The other gases when generate the intermediate compounds having the carbene structure can be used under varying temperature conditions.

Oxygen or nitrogen can be supplied to help control etch profiles, and an inert gas such as argon or helium can be provided as a carrier gas. Alternately, the main etching gas can be a compound including fluorine such as $F_2$, $SF_6$, $CF_4$, or $CHF_3$. A method for etching the polysilicon layer according to the present invention will be discussed using chlorine as the main etching gas.

In particular, the method for etching a polysilicon layer will be discussed using chlorine ($CL_2$) as a main etching gas, bromomethane ($CH_3Br$) as the gas which generates the intermediate compound, oxygen ($O_2$) to control the etching profile, and argon (Ar) as the carrier gas. These gases are provided in the reaction chamber and converted to a plasma state by an applied radio frequency signal. The chemical reactions are illustrated in the equations listed below.

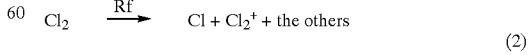

(wherein x is 0 or 1, y and z are each 0 to 2, and Rf means radio frequency)

$$O_2 \xrightarrow{Rf} O + O_2^+ + \text{the others} \qquad (3)$$

In addition, the argon or other inert gas is dissociated and activated.

The chemical components shown above which are activated in the plasma state react with the unmasked exposed portions of the polysilicon layer 14 as shown in the following equations.

Cl (or Cl$_{2+}$)+Si of polysilicon layer→SiCl (4)

Br+Si of polysilicon layer→SiBr (5)

C$_x$H$_y$Br$_z$+Si of polysilicon layer→polymer chain (6)

The activated chlorine from Equation 1 moves to the surface of the polysilicon layer 14 as a result of loading in the argon carrier gas. The activated chlorine is bonded to silicon components at the surface of the polysilicon layer 14 as shown in Equation 4 to generate silicon chloride (SiCl). The silicon chloride is deposited on the surface of the polysilicon layer 14. As shown in FIG. 2, bromine is generated in the plasma state. This bromine is bonded to silicon components at the surface of the polysilicon layer 14 to form an SiBr polymer which is deposited on the surface of the polysilicon layer as shown in Equation 5.

In addition, C$_x$H$_y$Br$_z$ is generated as shown in Equation 2 and this intermediate compound has a carbene (H—C—Br) structure. The C$_x$H$_y$Br$_z$ is bonded to silicon components at the surface of the polysilicon layer 14 as shown in Equation 6. Accordingly, a polymer bonded in a chain pattern such as C$_x$H$_y$Br$_z$—C$_x$H$_y$Br$_z$ is present at the surface of the polysilicon layer and the sidewalls of the profile formed by etching. The intermediate compound having the carbene structure is expressed as C$_x$H$_y$Br$_z$ wherein x varies from 0 to 1, and y and z each vary from 0 to 2. Accordingly, hydrogen bromide carbene (CHBr), dihydrogen carbene (CH$_2$), and dibromocarbene (CBr$_2$) can be generated and each can form a portion of the polymer.

The polysilicon layer 14 etched according to the method discussed above is shown in FIGS. 3A and 3B. In particular, the polysilicon layer is etched by the formation of SiCl and SiBr, and as the polysilicon layer is etched, SiBr and C$_x$H$_y$Br$_z$—C$_x$H$_y$Br$_z$ are adsorbed or formed as a polymer on the surface being etched. In particular, these polymers can be formed on the exposed surfaces of the polysilicon layer 14. These exposed surfaces include the bottom etched surface and the resulting sidewalls. The resulting polymer layer 18 which is formed on the sidewalls interrupts the reaction of the silicon at the surface of the sidewalls with the chlorine in the plasma state thus increasing the perpendicularity of the sidewalls with respect to the bottom etch surface. Because the polymer layer 18 reduces the reaction of the silicon at the surface of the sidewalls, over etching of the sidewalls can be reduced and the perpendicularity of the sidewall profile can be enhanced.

These polymers, however, may also form on the bottom etching surface thus interrupting the reaction of the silicon at the bottom etching surface with the chlorine in the plasma state. Accordingly, the polymers may inhibit the desired etching. The formation of polymers on the bottom etching surface, however, can be inhibited by the physical sputtering of the activated argon. Accordingly, the effect of polymer formation on the vertical etch rate can be reduced.

In addition to the physical sputtering of the bottom etching surface discussed above, the argon also sputters the masking layer 16 of photoresist. Carbon compounds from the photoresist are thus diffused by the physical sputtering of argon. Because carbon has a relatively high affinity to oxygen, the carbon may bind with oxygen contained in any exposed silicon oxide. Accordingly, when a silicon oxide layer 12 is provided beneath the polysilicon layer 14 being etched as shown in FIG. 2, the carbon may bind with the oxygen of the silicon oxide layer once the polysilicon layer 14 has been etched through. When oxygen of a silicon oxide layer binds with the carbon, etching may continue through the silicon oxide layer 12. Selectivity of the etch with respect to the polysilicon and silicon oxide layers may thus be reduced.

In order to increase the selectivity of the etch, oxygen can be provided thus reducing the rate at which the silicon oxide layer is etched. When oxygen is converted to a plasma state including radical (O) and ionic (O$_2^+$) states, the carbon sputtered from the photoresist bonds with the oxygen to generate carbon monoxide (CO) and carbon dioxide (CO$_2$). Alternately, nitrogen can be used to bind the carbon. By supplying oxygen or nitrogen, the selectivity of the etch between the polysilicon layer and the silicon oxide layer can be enhanced. If too much oxygen is provided with respect to the amount of chlorine provided, however, the etch of the polysilicon layer may be inhibited. An appropriate quantity of oxygen is thus desired. In particular, a preferred ratio of chlorine gas to oxygen gas may be on the order of about 2:1 to 6:1. The results of an etch performed according to the method of the present invention are illustrated in FIGS. 3A and 3B.

The conditions for the etch used to produce the profiles of FIGS. 3A and 3B were as follows. Cl$_2$ was supplied as the main etching gas, and CH$_3$Br, O$_2$, and an inert gas were mixed. In addition, the etching apparatus was configured to provide electrical power on the order of 800–1000 W, bias power on the order of 0–300 W, and total pressure on the order of 2–15 mT. In addition, the gases were provided at the following rates: Cl$_2$ was provided at 10–200 sccm; CH$_3$Br was provided at 2–100 sccm; O$_2$ was provided at 0–100 sccm; and the inert gas was provided at 0–200 sccm. The unit sccm is a unit of gas supply which represents a standard cubic centimeter of fluid supplied per minute at 0° C. and 1 atmosphere. Furthermore, the temperature of the reaction was maintained in the range of −20 to 60° C.

Figure 1B:
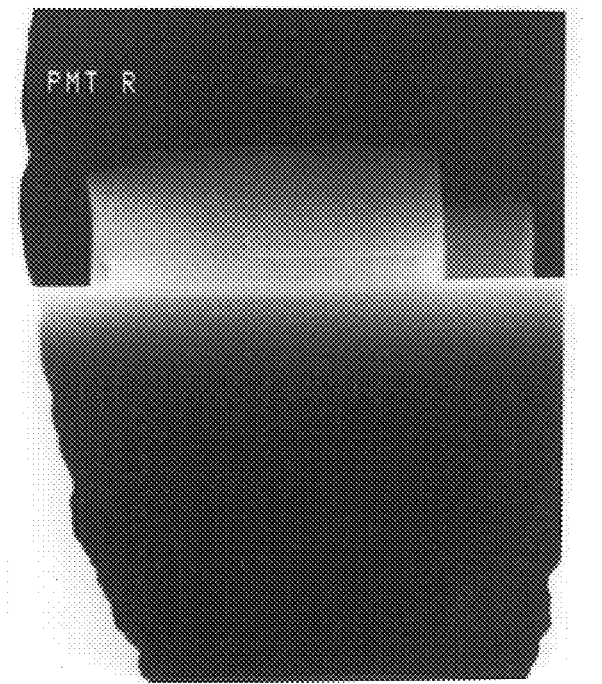

As discussed above, FIGS. 3A and 3B illustrate the profiles of polysilicon layers etched by plasma etching methods according to the present invention, while FIGS. 1A and 1B illustrate profiles of polysilicon layers etched according to a conventional method. As shown in FIGS. 3A and 3B, the boundary between the photoresist layer 16 and the polysilicon layer 14 can be maintained as a smooth straight line, and the overall profile of the etched polysilicon layer has an approximately square shape because the sidewalls are formed perpendicular with respect to the bottom etching surface. In contrast, in the profiles illustrated in FIGS. 1A and 1B, the boundary plane between the photoresist layer 16 and the polysilicon layer 14 is not smooth and straight, and the overall profile of the etched polysilicon has the shape of a reverse-trapezoid because the sidewalls are tilted.

Figure 3A:
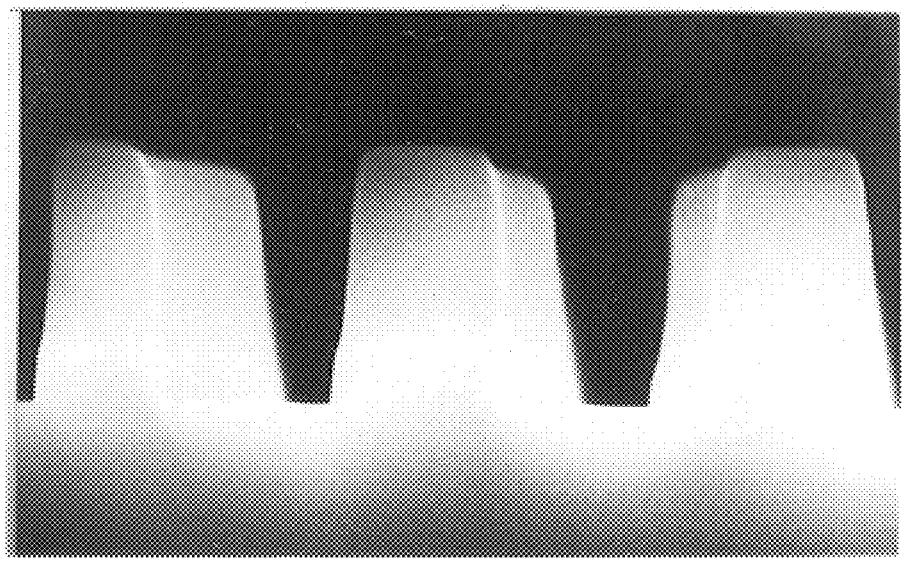
FIGS. 3A and 3B are photographs illustrating etching profiles for a layer of a material including silicon which has been etched by a plasma etching method according to the present invention.
Figure 3B:
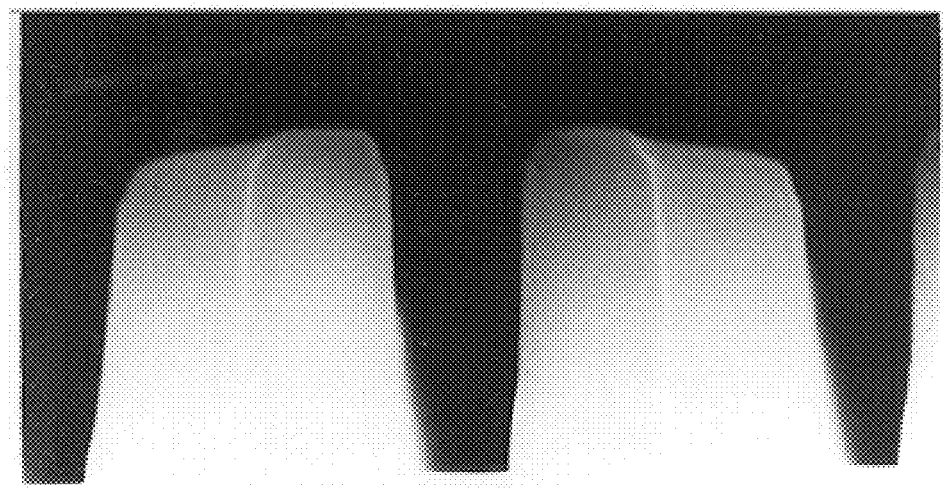

In addition, the profile illustrated in FIGS. 3A and 3B is formed by etching methods of the present invention, and the trenching phenomenon is reduced. Accordingly, the etching methods of the present invention can be used to produce highly-integrated ultra-fine patterns in a polysilicon layer, and the resulting etched polysilicon layer can have smooth surfaces with perpendicular sidewalls as shown in FIGS. 3A and 3B.

According to another aspect of the present invention, the main etching gas can be a gas including fluorine such as $F_2$, $SF_6$, $CF_4$ or $CHF_3$. As before, an additional gas such as $CH_3Br$, $CH_2Br_2$, $CHBr_3$, $C_2H_5Br$ or $C_2H_4Br_2$ which generates an intermediate compound having a carbene structure when exposed to a plasma discharge can also be used. This combination of gases can be used to etch a polysilicon layer or layers of other materials including silicon. As previously discussed, gases such as oxygen or nitrogen can be used to increase etch selectivity with respect to layers including oxygen, and inert gases such as helium and argon can be used to clear polymers from the bottom etching surface. The etching environment can be maintained as discussed above with regard to the etch using gases including chlorine. As before, polymers which form on the sidewalls of the etch layer act as a passivation layer reducing undesired etching of the sidewall and improving the result. Accordingly, the second aspect of the etching method of the present invention can be used to provide highly-integrated ultra-fine patterns in polysilicon layers and other layers of materials including silicon.

According to a third aspect of the present invention, a plasma etching method can be used to etch silicon oxide layers. In particular, the main etching gas can be a gas including fluorine such as $F_2$, $SF_6$, $CF_4$, or $CHF_3$. An additional gas such as $CH_3Br$, $CH_2Br_2$, $CHBr_3$, $C_2H_5Br$, or $C_2H_4Br_2$ is used, and the additional gas generates an intermediate compound having a carbene structure when exposed to the plasma discharge. In addition, other gases such as argon or helium can be added to the mixture to etch the silicon oxide layer.

According to a fourth aspect of the present invention, a main etching gas is mixed with a gas wherein a bromine atom is bonded with another atom from the halogen group. For example, BrI or $Br_2$ can be mixed with the main etching gas to form polymers on the sidewalls of a layer of a material including silicon which is being etched. According to a fifth aspect of the present invention, the main etching gas is mixed with $BBr_3$ as the additional gas to etch a layer of a material including silicon. As discussed above, the formation of polymers on the sidewalls of the layer being etched increases the perpendicularity of the sidewalls thus improving the profile of the etched layer. According to a sixth aspect of the present invention, a main etching gas can be mixed with an additional gas which generates an intermediate compound having a carbene structure when exposed to the plasma discharge to etch a metal layer. As before, polymers form on the sidewalls of the etched layer thus improving the perpendicularity of the sidewalls and improving the profile of the etched layer.

Figure 4:
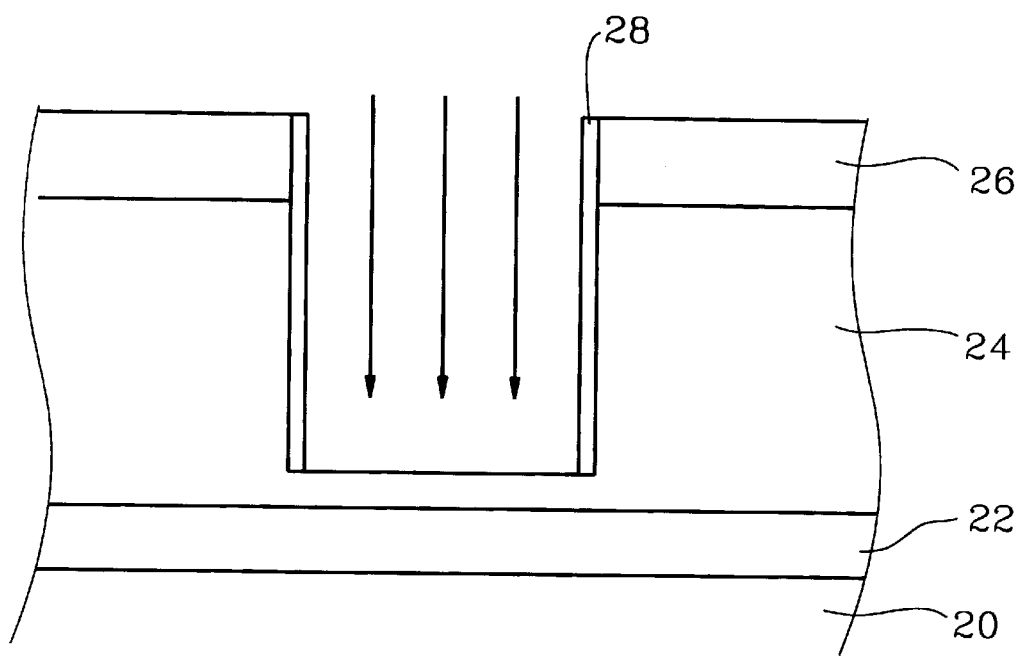
FIG. 4 is a cross sectional view of a microelectronic structure including a metal layer which has been etched by a plasma etching method according to the present invention.

A method for etching a metal layer 24 of a microelectronic structure will now be discussed with reference to FIG. 4. This method includes masking the metal layer 24 to be etched with an etching mask such as a photoresist mask 26 so that portions of the metal layer 24 are exposed, supplying an etching gas, and supplying an additional gas which generates a compound having a carbene structure when exposed to a plasma discharge. A plasma of the etching gas and the additional gas is generated to thereby etch the exposed portions of the metal layer 24 and to form the compound having the carbene structure. More particularly, the etching gas can be an etching gas including chlorine such as $Cl_2$, BCl, HCl, and $SiCl_4$.

In addition, the generation of the plasma can result in formation of a polymer layer 28 on sidewalls of etched portions of the metal layer 24 wherein the polymer is formed from the compound having the carbene structure. The method can also include supplying an inert gas such as helium and/or argon, generating a plasma of said inert gas, and colliding the inert gas with the exposed portion of the metal layer to remove etch by-products. The etching gas can also include a gas including fluorine such as $F_2$, $SF_6$, $CF_4$, and $CHF_3$.

The additional gas can include a compound such as $CH_3Br$, $CH_2Br_2$, $CHBr_3$, $C_2H_5Br$, and $C_2H_4Br_2$, and the intermediate compound having the carbene structure can be $C_xH_yBr_z$, wherein each of x, y, and z is an integer having a value of zero or greater. More particularly, the compound having the carbene structure can include a compound such as hydrogen bromide carbene (:CHBr), dihydrogen carbene (:$CH_2$), or dibromocarbene (:$CBr_2$). In addition, the microelectronic structure can include the metal layer 24 to be etched on a layer 22 of silicon oxide ($SiO_2$) opposite the substrate 20, and the method can further include supplying oxygen and generating a plasma of the oxygen.

By providing additional gases which generated intermediate compounds having carbene structures when performing a dry etch, the profile of the etched layer can be improved. In particular, polymers are formed on the sidewalls of the etched layer from the intermediate compound having the carbene structure. These polymer layers provide a passivation for the sidewalls thus improving the perpendicularity of the sidewalls and the overall profile for the etched layer. Ultra-fine highly-integrated patterns can thus be formed by the dry etching methods of the present invention. Accordingly, both the capacity and functionality of integrated circuit devices can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for etching a layer of a microelectronic structure wherein said layer to be etched comprises a layer of polysilicon, said method comprising steps of:
    masking said polysilicon layer to be etched so that portions of said polysilicon layer are exposed;
    supplying an etching gas;
    supplying an additional gas which generates a compound having a carbene structure when exposed to a plasma discharge; and
    generating a plasma of said etching gas and said additional gas to thereby etch said exposed portions of said polysilicon layer and to form said compound having said carbene structure.

2. A method according to claim 1 wherein said generating step further comprises forming a polymer on sidewalls of etched portions of said layer wherein said polymer is formed from said compound having said carbene structure.

3. A method according to claim 1 wherein said etching gas includes chlorine.

4. A method according to claim 3 wherein said etching gas is chosen from the group consisting of $Cl_2$, BCl, HCl, and $SiCl_4$.

5. A method according to claim 1 wherein said etching gas includes fluorine.

6. A method according to claim 5 wherein said etching gas is chosen from the group consisting of $F_2$, $SF_6$, $CF_4$, and $CHF_3$.

7. A method according to claim 1 further comprising steps of:
    supplying an inert gas;

generating a plasma of said inert gas; and colliding said inert gas with said exposed portion of said layer to remove etch by-products.

8. A method according to claim 7 wherein said inert gas is chosen from the group consisting of helium and argon.

9. A method according to claim 1 wherein said additional gas comprises a compound chosen from the group consisting of $CH_3Br$, $CH_2Br_2$, $CHBr_3$, $C_2H_5Br$, and $C_2H_4Br_2$.

10. A method according to claim 1 wherein said compound having said carbene structure comprises $C_xH_yBr_z$, and wherein each of x, y, and z is an integer having a value of zero or greater.

11. A method according to claim 10 wherein said compound having said carbene structure comprises a compound chosen from the group consisting of hydrogen bromide carbene (:CHBr), dihydrogen carbene (:$CH_2$), and dibromocarbene (:$CBr_2$).

12. A method according to claim 1 wherein said additional gas comprises bromomethane ($CH_3Br$), and wherein said steps of generating said plasma and forming said polymer are performed at room temperature.

13. A method according to claim 1 wherein said step of generating said plasma comprises generating said plasma by one of inductive and capacitive coupling.

14. A method for etching a layer of a microelectronic structure wherein said microelectronic structure comprises a layer of polysilicon to be etched on a layer of silicon oxide ($SiO_2$), said method comprising steps of:

masking said polysilicon layer to be etched so that portions of said polysilicon layer are exposed;

supplying an etching gas;

supplying an additional gas which generates a compound having a carbene structure when exposed to a plasma discharge;

generating a plasma of said etching gas and said additional gas to thereby etch said exposed portions of said polysilicon layer and to form said compound having said carbene structure;

supplying oxygen; and generating a plasma of said oxygen.

15. A method according to claim 14 wherein a ratio of said etching gas to said oxygen provided is on the order of 2:1 to 6:1.

16. A method for etching a metal layer of a microelectronic structure, said method comprising steps of:

masking said metal layer to be etched so that portions of said metal layer are exposed;

supplying an etching gas;

supplying an additional gas which generates a compound having a carbene structure when exposed to a plasma discharge; and generating a plasma of said etching gas and said additional gas to thereby etch said exposed portions of said metal layer and to form said compound having said carbene structure;

wherein said etching gas includes chlorine.

17. A method according to claim 16 wherein said generating step comprises forming a polymer on sidewalls of etched portions of said metal layer wherein said polymer is formed from said compound having said carbene structure.

18. A method according to claim 16 wherein said etching gas is chosen from the group consisting of $Cl_2$, BCl, HCl, and $SiCl_4$.

19. A method according to claim 16 further comprising steps of:

supplying an inert gas;

generating a plasma of said inert gas; and colliding said inert gas with said exposed portion of said metal layer to remove etch by-products.

20. A method according to claim 19 wherein said inert gas is chosen from the group consisting of helium and argon.

21. A method according to claim 16 wherein said etching gas includes fluorine.

22. A method according to claim 21 wherein said etching gas is chosen from the group consisting of $F_2$, $SF_6$, $CF_4$, and $CHF_3$.

23. A method according to claim 16 wherein said additional gas comprises a compound chosen from the group consisting of $CH_3Br$, $CH_2Br_2$, $CHBr_3$, $C_2H_5Br$, and $C_2H_4Br_2$.

24. A method according to claim 16 wherein said intermediate compound having said carbene structure comprises $C_xH_yBr_z$, and wherein each of x, y, and z is an integer having a value of zero or greater.

25. A method according to claim 24 wherein said compound having said carbene structure comprises a compound chosen from the group consisting of hydrogen bromide carbene (:CHBr), dihydrogen carbene (:$CH_2$), and dibromocarbene (:$CBr_2$).

26. A method according to claim 16 wherein said microelectronic structure comprises said metal layer to be etched on a layer of silicon oxide ($SiO_2$), said method further comprising the steps of:

supplying oxygen; and generating a plasma of said oxygen.

* * * * *